United States Patent
Kim

(10) Patent No.: US 7,074,702 B2
(45) Date of Patent: Jul. 11, 2006

(54) METHODS OF MANUFACTURING SEMICONDUCTOR DEVICES

(75) Inventor: Seung Hyun Kim, Choongcheongbuk-Do (KR)

(73) Assignee: Donghu Electronics, Co. Ltd., Seoul (KR)

( * ) Notice: Subject to any disclaimer, the term of this patent is extended or adjusted under 35 U.S.C. 154(b) by 0 days.

(21) Appl. No.: 10/746,837

(22) Filed: Dec. 26, 2003

(65) Prior Publication Data

US 2004/0142553 A1    Jul. 22, 2004

(30) Foreign Application Priority Data

Dec. 30, 2002   (KR) .................. 10-2002-0086878

(51) Int. Cl.
*H01L 21/44* (2006.01)

(52) U.S. Cl. .................... 438/597; 438/622; 438/631; 438/694

(58) Field of Classification Search ................ 438/622, 438/631, 626, 694, 597
See application file for complete search history.

(56) References Cited

U.S. PATENT DOCUMENTS

| | | | |
|---|---|---|---|
| 5,896,870 A | 4/1999 | Huynh et al. ............... 134/1.3 |
| 5,922,620 A | 7/1999 | Shimomura et al. ........ 438/693 |
| 6,117,766 A * | 9/2000 | Yoon et al. ................. 438/637 |
| 6,133,139 A * | 10/2000 | Dalal et al. ................. 438/624 |
| 6,149,830 A | 11/2000 | Lin et al. ...................... 216/89 |
| 6,383,935 B1 | 5/2002 | Lin et al. .................... 438/692 |
| 6,645,846 B1 * | 11/2003 | Drynan et al. ............. 438/622 |

* cited by examiner

*Primary Examiner*—Zandra V. Smith
*Assistant Examiner*—Christy Novacek
(74) *Attorney, Agent, or Firm*—Saliwanchik, Lloyd & Saliwanchik

(57) ABSTRACT

Disclosed are methods of manufacturing semiconductor devices, which may solve problems such as a short of upper wiring, etc., which are caused by a metal residue generated during chemical mechanical polishing of metallization of the semiconductor device, by depositing a predetermined insulating layer on the metal residue. The method may include forming a first insulating layer having an opening on a semiconductor substrate, depositing a metal layer on the first insulating layer to sufficiently fill the opening, planarizing the metal layer to expose the first insulating layer, forming a second insulating layer on the exposed first insulating layer and the metal layer, selectively etching and removing the second insulating layer to expose the metal layer, and forming a metallization layer on the metal layer.

3 Claims, 7 Drawing Sheets

METHODS OF MANUFACTURING SEMICONDUCTOR DEVICES

TECHNICAL FIELD

The present invention relates to semiconductor devices and, more particularly, to methods of manufacturing semiconductor devices.

BACKGROUND

Recently, with rapid distribution of information via media such as computers, semiconductor devices have rapidly progressed. In the functional aspect, semiconductor devices are required to be operated at high speeds and, at the same time, to have mass storage capability. In response to these functional requirements, semiconductor manufacturing technology has made progress toward enhancing integration, reliability, response speed, and so on. As primary technology for enhancing integration of the semiconductor devices, fine processing technology becomes more and more strict in its requirements.

One of technologies for enhancing such integration is planarization on technology. In recent semiconductor manufacture, chemical mechanical polishing (CMP) of directly polishing an object to be polished using a polishing pad is mainly used.

The CMP is disclosed in U.S. Pat. No. 5,896,870 (International Business Machines Corporation) and U.S. Pat. No. 5,922,620 (Kabushiki Kaisha Toshiba). However, in the CMP, an object to be polished is polished with the use of a polishing pad while polishing particulates called slurry are injected, so that it is easy for a scratch, etc. to be generated on the polished object after polishing. This scratch is responsible for generation of a metal residue during a subsequent process such as a process for forming a metal layer pattern.

Further, a metal residue, a portion to be polished, which is not still polished and left after the CMP is performed, is easily generated. This metal residue is generated from non-uniform planarization during the CMP as a wafer is scaled up to large diameter and a height difference between surfaces of processed layers is increased.

Particularly, in the case where the metal residue is generated during formation of the metal layer pattern by means of the CMP, this metal residue causes a bridge, etc. to be generated between the metal layer patterns, so that a failure occurs at the semiconductor device.

FIGS. 1 to 5 are process sectional views for explaining a known method of manufacturing a semiconductor device.

FIG. 1 shows a process for forming an insulating layer 103 on a semiconductor substrate 101 on which a substructure 102 is formed. To be specific, the substructure 102, such as a gate electrode, a polysilicon line, or so forth, which constitutes the semiconductor device, is formed on the semiconductor substrate 101. The insulating layer 103 is formed of a dielectric, such as silicon oxide, boro-phospho-silicate glass (BPSG), or so forth, on the semiconductor substrate 101 on which the substructure 102 is formed by chemical vapor deposition (CVD).

FIG. 2 shows a process for planarizing the insulating layer 103. The insulating layer 103 is polished and planarized by the CMP. Here, a scratch 104a and so-called a dishing 104b (i.e., where a space between patterns is hollowed) are generated on the planarized insulating layer 103. The scratch 104a and the dishing 104b result in generation of the metal residue while a following metal layer pattern is formed.

FIG. 3 shows a process for forming an opening 105 at the planarized insulating layer 103. The opening 105 is formed by forming a photoresist pattern (not shown) for exposing a part of the top surface of the semiconductor substrate 101 and a part of the top surface of the substructure 102 on the planarized insulating layer 103, etching the planarized insulating layer 103 using the photo resist pattern as an etch mask, and exposing the part of the top surface of the semiconductor substrate 101 and a part of the top surface of the substructure 102.

FIG. 4 shows a process for forming a metal layer 106 on the insulating layer 103. Specifically, the metal layer 106 is formed by depositing a metal material, such as aluminum (Al), tungsten (W), molybdenum (Mo) or the like, on the insulating layer 103 by means of sputtering to fill the opening 105.

FIG. 5 shows a process for polishing the metal layer 106 until the top surface of the insulating layer 103 is exposed and removing the metal layer which exists except the opening.

According to the above-mentioned method, as shown, the metal material is buried in the scratch 104a and the dishing 104b generated during polishing of the insulating layer 103. The metal material, which is buried in the scratch 104a and the dishing 104b after the metal layer 106 is polished, is formed as a metal residue remaining on the top surface of the insulating layer 103. Further, a part of the metal material, which is left without being polished after the metal layer 106 is polished, is also formed as such a metal residue on the top surface of the insulating layer 103. The metal residue leads to a failure of the semiconductor such as a metal bridge during formation of the metal layer pattern having a fine design rule.

DETAILED DESCRIPTION

Figure 1:
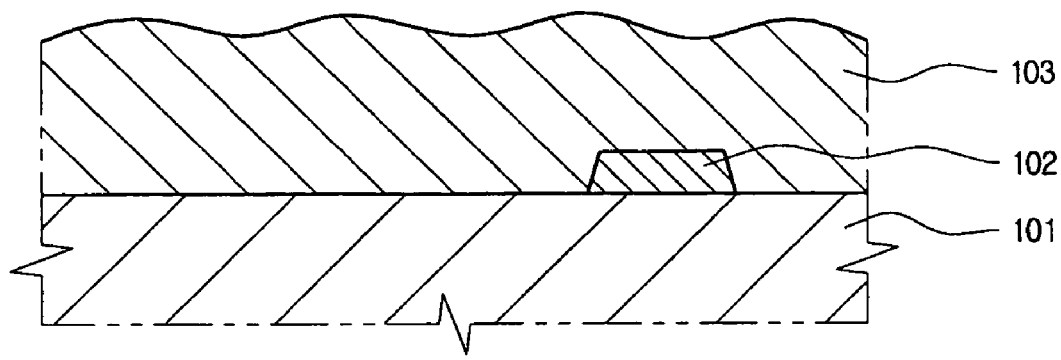
FIGS. 1 to 5 are process sectional views for explaining a known method of manufacturing a semiconductor device according to the prior art.
Figure 2:
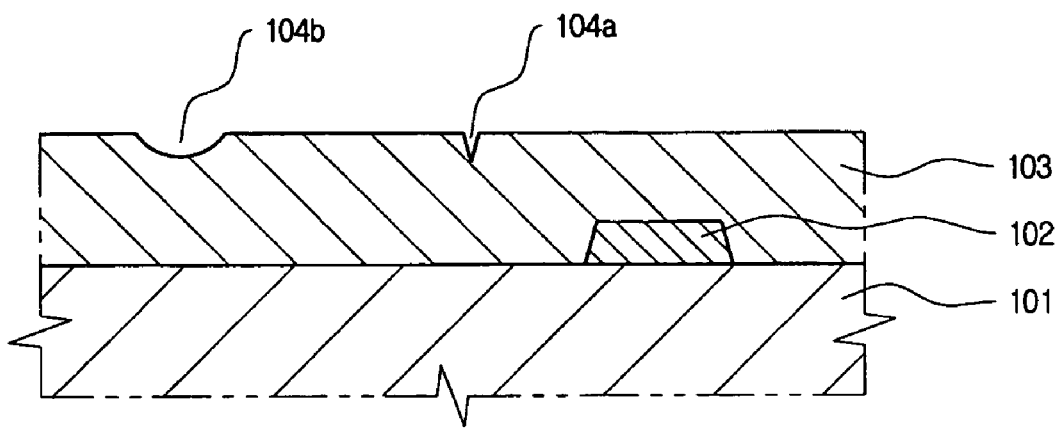
Figure 3:
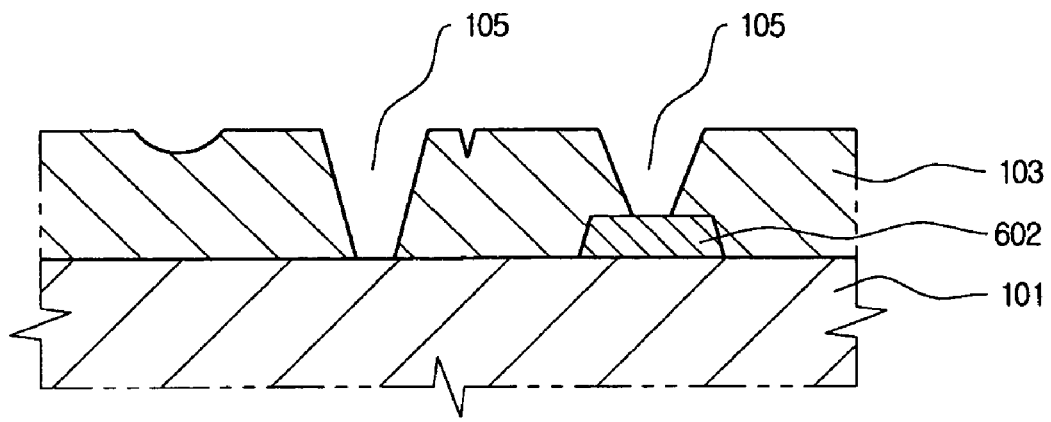
Figure 4:
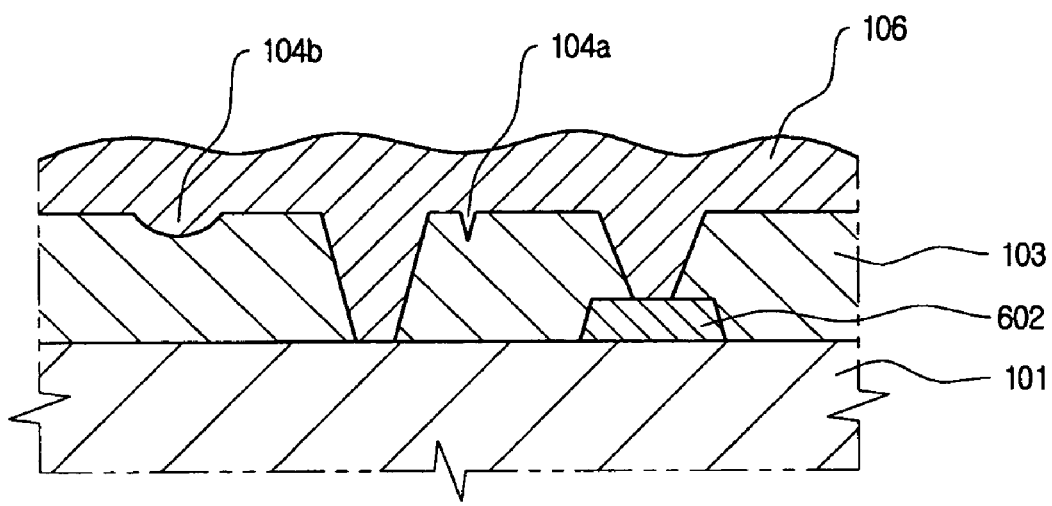
Figure 5:
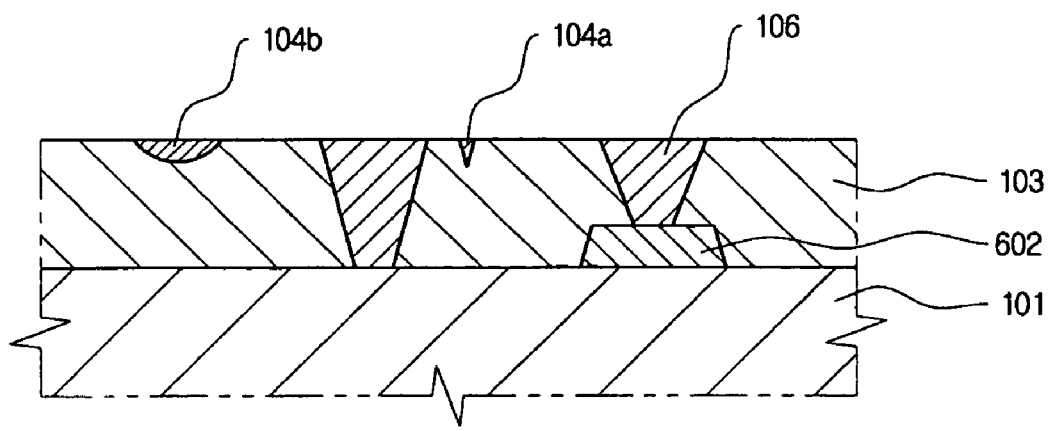
Figure 6:
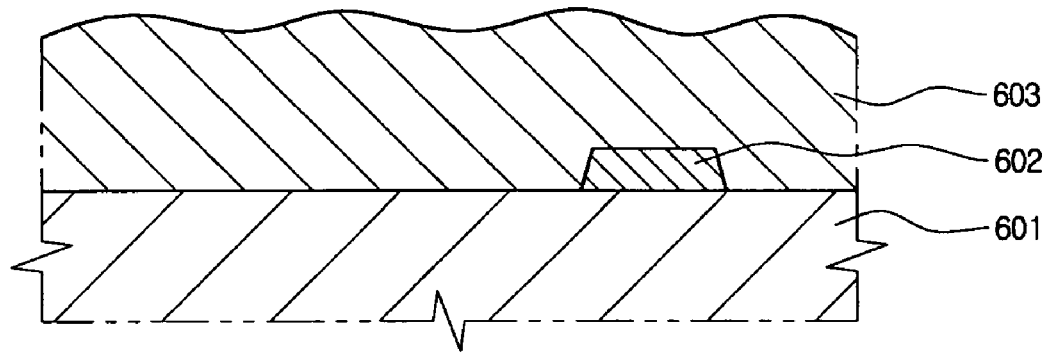
FIGS. 6 to 13 are process sectional views for explaining a disclosed example method of manufacturing a semiconductor device.

FIG. 6 shows a process for forming a first insulating layer 603 on a semiconductor substrate 601, on which a substructure 602, such as a gate electrode, a polysilicon line, or so forth, which constitutes the semiconductor device, may be formed on the semiconductor substrate 601. The first insulating layer is formed of an insulator, such as silicon oxide, boro-phospho-silicate glass (BPSG) or so forth, by chemical vapor deposition (CVD).

Figure 7:
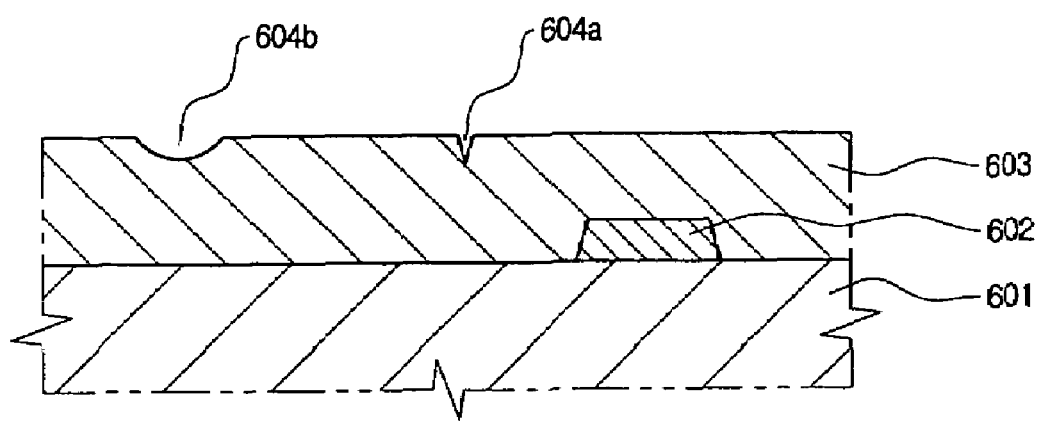

FIG. 7 shows a process for planarizing the first insulating layer 603. The first insulating layer 603 is planarized by chemical mechanical polishing (CMP). However, a scratch 604a and a dishing 604b are generated on the surface of the planarized first insulating layer 603 due to the CMP.

Figure 8:
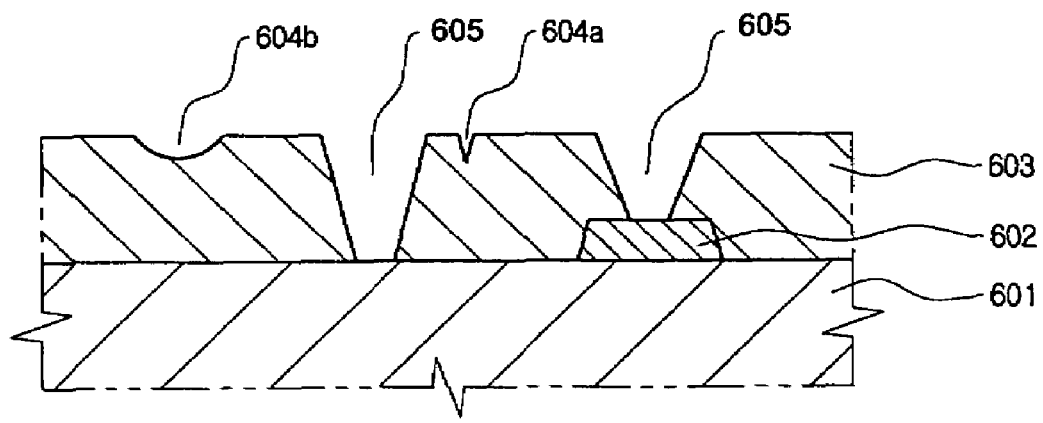

FIG. 8 shows a process for forming an opening 605 at the planarized first insulating layer 603. The opening 605 is formed by forming a photoresist pattern (not shown) for exposing a part of the top surface of the semiconductor substrate 601 and a part of the top surface of the substructure 602 on the planarized first insulating layer 603, etching the planarized first insulating layer 603 using the photo resist pattern as an etch mask, and exposing the part of the top surface of the semiconductor substrate 601 and the part of the top surface of the substructure 602.

Figure 9:
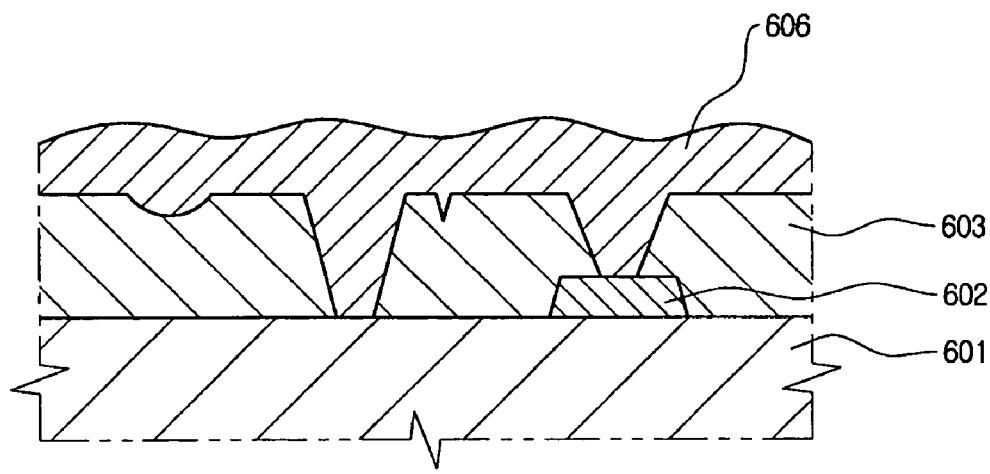

FIG. 9 shows a process for depositing a metal layer 606 on the planarized first insulating layer 603. Specifically, the metal layer 606 is formed by depositing a metal material on the planarized first insulating layer 603 to fill the opening 605. The metal material includes aluminum (Al), tungsten (W), molybdenum (Mo), and the like.

Figure 10:
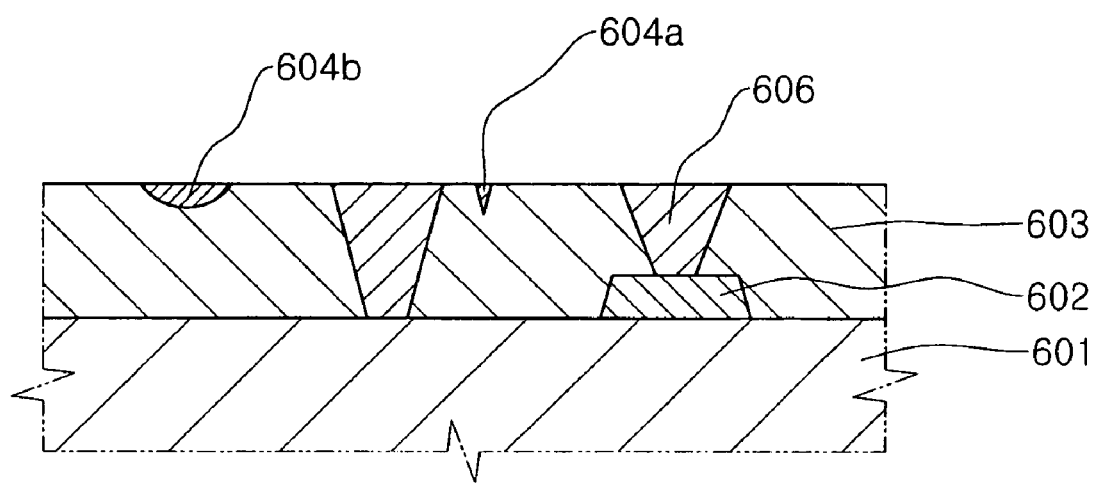

FIG. 10 shows a process for performing CMP to the metal layer 606. To be specific, the metal layer 606 is subjected to CMP until the top surface of the first insulating layer 603 is exposed, and the metal layer 606, which exists except the opening is removed However, a metal is buried in the scratch 604*a* and the dishing 604*b* generated during polishing of the first insulating layer 603. The metal, which is buried in the scratch 604*a* and the dishing 604*b* after the metal layer 606 is polished, is formed as a metal residue remaining on the top surface of the first insulating layer 603. Further, a part of the metal, which is left without being polished on the top surface of the first insulating layer 603 after the metal layer 606 is polished, is also formed as such a metal residue. The metal residue is generated from non-uniform planarization during polishing as a semiconductor wafer is scaled up to large diameter as well as a height difference between a cell region and a peripheral circuit region in the semiconductor device is increased. The metal residue leads to a serious failure of the semiconductor such as a metal bridge during formation of a metal layer pattern having a fine design rule.

Figure 11:
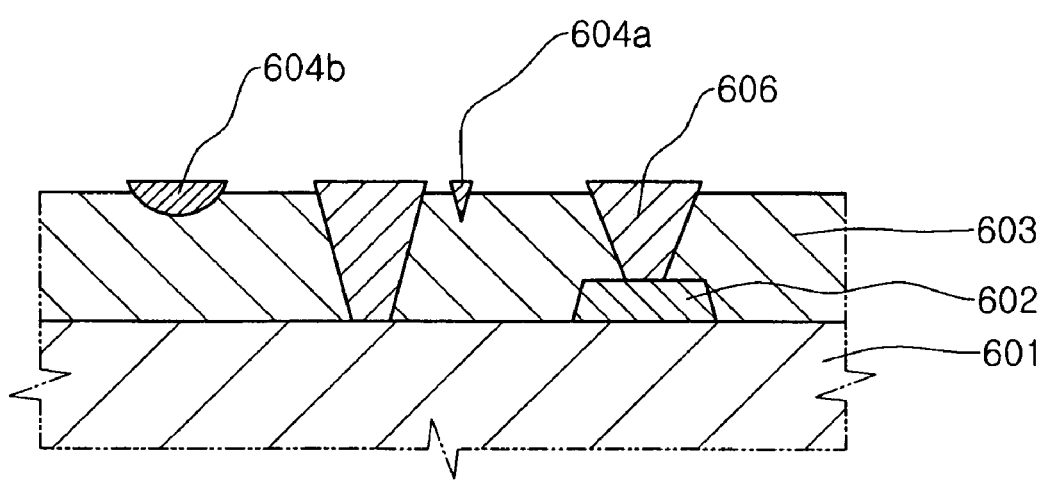
Figure 12:
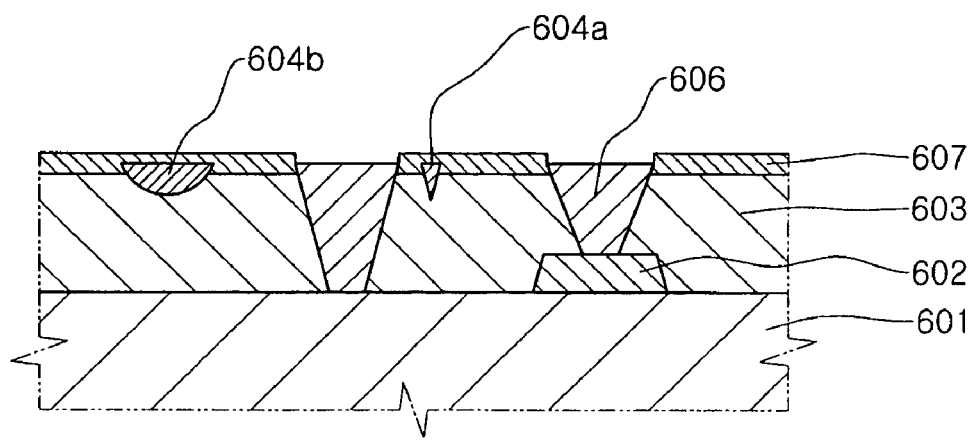

In this state, as shown in FIG. 11, the first insulating layer 603 is etched and removed about 50 to 200 Å in dept. One reason to do so is to eliminate the fine scratch or dishing, which exists on the top surface of the first insulating layer 603, by etching the first insulating layer 603 at a predetermined thickness.Subsequently, as shown in FIG. 12, a second insulating layer 607 is deposited on the exposed first insulating layer and the metal layer. This deposition of the second insulating layer 607 makes it possible to prevent a short between the metal layers, which is caused by intervention of the metal material into the scratch 604*a* or dishing 604*b*. Here, as a material for the second insulating layer 607, boro-phospho-silicate glass (BPSG), phospho-silicate glass (PSG), boro-silicate glass (BSG), fluorine-doped silicate glass (FSG) or so forth may be used, and as its thickness, 300 to 1000 Å is preferable. Further, the second insulating layer 607 may be deposited by spin coating or CVD. In the state where the second insulating layer 607 is deposited, the second insulating layer is selectively etched and removed to expose the metal layer 606.

Figure 13:
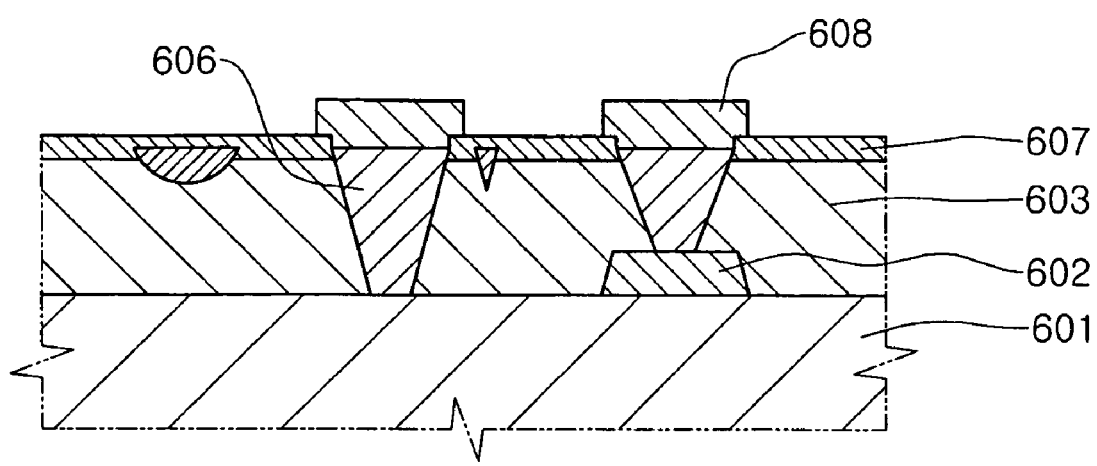

Then, as shown in FIG. 13, a desired metal material is deposited on the semiconductor substrate, and then a metallization layer 608 is patterned using typical photolithography and etching processes. As a result, the process for manufacturing the semiconductor device according to the present invention is completed.

The example method of manufacturing semiconductor devices as disclosed herein has effects as follows: By depositing a second insulating layer on an exposed first insulating layer and a plug metal layer, it is made possible to prevent generation of the electrical short between the metal layers of the upper portion of the plug due to scratch or dishing which may be generated in the first insulating layer. Thus, it is possible to prevent an electrical operation error or an electrical loss, which allows yield and stability of the semiconductor device to be guaranteed.

As disclosed herein, a method of manufacturing a semiconductor device which may solve problems such as a short of upper wiring, etc., which are caused by a metal residue generated during chemical mechanical polishing of metallization of the semiconductor device, by depositing a predetermined insulating layer covering the metal residue. According to one example, the method may include forming a first insulating layer having an opening on a semiconductor substrate, depositing a metal layer on the first insulating layer to sufficiently fill the opening, planarizing the metal layer to expose the first insulating layer, forming a second insulating layer on the exposed first insulating layer and the metal layer, selectively etching and removing the second insulating layer to expose the metal layer, and forming a metallization layer on the metal layer.

The method may further include etching and removing the first insulating layer at a predetermined thickness after the metal layer is planarized. Accordingly, by depositing the insulating layer on the exposed insulating layer and the plug metal layer, it is made possible to prevent generation of the electrical short between the metal layers of the upper portion of the plug due to scratch or dishing which may be generated in the insulating layer.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of manufacturing a semiconductor device, comprising:
   forming a first insulating layer having an opening on a semiconductor substrate, wherein the first insulating layer is formed of a first material;
   depositing a metal layer on the first insulating layer to sufficiently fill the opening;
   planarizing the metal layer to expose the first insulating layer;
   etching the first insulating layer to cause the surface of the metal layer to protrude from a surface of the first insulating layer, wherein the first insulating layer is etched at a depth of 50 to 200 Å;
   forming a second insulating layer in contact with the exposed first insulating layer and the metal layer after etching the first insulating layer, wherein the second insulating layer is formed of a second material that is the same material as the first material;
   selectively etching and removing the second insulating layer to expose the metal layer; and
   forming a metallization layer on the metal layer.

2. A method as defined by claim 1, wherein the second insulating layer is formed using boro-phospho-silicato glass (BPSG).

3. A method as defined by claim 1, wherein the second insulating layer is formed at a thickness of 300 to 1000 Å.

* * * * *